(12) United States Patent
Agrawal et al.

(10) Patent No.: US 11,876,530 B2
(45) Date of Patent: Jan. 16, 2024

(54) LOW POWER BI-DIRECTIONAL ARCHITECTURE FOR CURRENT OUTPUT DIGITAL TO ANALOG CONVERSION

(71) Applicant: Texas Instruments Incorporated, Dallas, TX (US)

(72) Inventors: Atul Kumar Agrawal, Bangalore (IN); Kanak Chandra Das, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 5 days.

(21) Appl. No.: 17/491,391

(22) Filed: Sep. 30, 2021

(65) Prior Publication Data

US 2023/0100835 A1      Mar. 30, 2023

(51) Int. Cl.
   *H03M 1/78*   (2006.01)
   *H03M 1/74*   (2006.01)
   *H03M 1/66*   (2006.01)

(52) U.S. Cl.
   CPC .......... *H03M 1/785* (2013.01); *H03M 1/662* (2013.01); *H03M 1/742* (2013.01)

(58) Field of Classification Search
   CPC ....... H03M 1/785; H03M 1/662; H03M 1/742

USPC ......................................... 341/144, 145, 154
See application file for complete search history.

(56) References Cited

U.S. PATENT DOCUMENTS

| | | | | |
|---|---|---|---|---|
| 7,764,210 B2* | 7/2010 | Rentala | .................. | H04N 5/148 |
| | | | | 341/144 |
| 8,570,199 B2* | 10/2013 | Cyrusian | ............. | H03M 1/0845 |
| | | | | 341/118 |
| 9,007,288 B2* | 4/2015 | Chang | .................. | H03M 1/682 |
| | | | | 345/91 |

* cited by examiner

*Primary Examiner* — Khai M Nguyen
(74) *Attorney, Agent, or Firm* — John R. Pessetto; Frank D. Cimino (57) ABSTRACT

An example apparatus includes: a voltage-to-current circuit including a first input terminal, a first output terminal and a second output terminal, a subtraction circuit including a second input terminal and a third output terminal, the second input terminal coupled to the second output terminal, a first driver circuit including a third input terminal and a fourth output terminal, the third input terminal coupled to the third output terminal, and a second driver circuit including a fourth input terminal and a fifth output terminal, the fourth input terminal coupled to the first output terminal, the fifth output coupled to the fourth output terminal.

15 Claims, 5 Drawing Sheets

LOW POWER BI-DIRECTIONAL ARCHITECTURE FOR CURRENT OUTPUT DIGITAL TO ANALOG CONVERSION

TECHNICAL FIELD

This description relates generally to circuits, and more particularly to low power bi-directional architecture for current output digital to analog conversion.

BACKGROUND

Mixed signal applications (e.g., applications that utilize analog circuitry and digital/logic circuitry) often require a digital to analog converter (DAC) system capable of linear, efficient, and effective operation to generate an analog representation of a digital value, which may be referred to as a DAC code. In some applications, a DAC designed to output a current, which may be referred to as an IDAC, may be configured to convert a digital value (such as a DAC code) into an analog current of a magnitude specific to the digital value. An IDAC may be configured to supply, or source, current to a current terminal. An IDAC may also be configured to take in, or sink, current from the current terminal. A unipolar IDAC is an IDAC configured to either source current or sink current. A bi-directional IDAC is an IDAC configured to source and/or sink current based on DAC codes.

SUMMARY

An example embodiment includes a low-power, bi-directional IDAC including: a voltage to current circuit including a voltage-to-current circuit including a first input terminal, a first output terminal and a second output terminal, a subtraction circuit including a second input terminal and a third output terminal, the second input terminal coupled to the second output terminal, a first driver circuit including a third input terminal and a fourth output terminal, the third input terminal coupled to the third output terminal, and a second driver circuit including a fourth input terminal and a fifth output terminal, the fourth input terminal coupled to the first output terminal, the fifth output coupled to the fourth output terminal.

As described in more details below, some embodiments include a DAC that outputs either an analog voltage or an analog current representation of an input DAC code. In addition, some embodiments include an IDAC that uses low power and/or provides a linear translation of digital codes to analog current output.

BRIEF DESCRIPTION OF THE DRAWINGS

The same reference numbers or other reference designators are used in the drawings to designate the same or similar (functionally and/or structurally) features.

DETAILED DESCRIPTION

Mixed signal applications may utilize digital to analog converters (DACs) capable of efficient and effective operation at various operating conditions. In some such applications, a current digital-to-analog converter (IDAC) may source current and/or sink current, such that the total current sourced and/or sunk is an analog representation of a digital value (e.g., a DAC code) provided at the input of the IDAC. In some instances, the bit length of the digital input determines the potential accuracy of the total current sourced and/or sunk by the IDAC. When an IDAC is configured for unipolar operation, the IDAC is able to either source current or sink current. An IDAC configured for negative unipolar operation sinks current from the output. An IDAC configured for positive unipolar operation sources current to the output. A bi-directional (bipolar) IDAC is an IDAC configured to source and/or sink current based on DAC codes.

A DAC channel may include a VDAC to produce an output voltage based on a digital input (e.g., a DAC code). A VDAC may include a DAC ladder including multiple resistors (connected in series and/or in parallel) coupled to decoding logic (e.g., a multiplexer, a decoder) to generate the output voltage. A DAC may be implemented as a R-2R multiplying DAC (R-2R MDAC), R-2R back-DAC, or a string DAC. A DAC typically includes a resistor circuit, an amplifier, and a plurality of switches. The R-2R MDAC and R-2R back-DAC each include a resistor circuit having resistors of a first magnitude (R) and resistors of a second magnitude (2R), such that the resistors of the second magnitude are two times the first magnitude of the first resistors. The resistors of the first magnitude are coupled in series with the resistors of the second magnitude coupled between the series resistors and a switch.

The resistor circuit included in the string DAC is a series combination of resistors of approximately the same value, such that each resistor represents a voltage corresponding to a least significant bit (LSB) of a DAC code. A DAC implements a series of switches to couple an input of the amplifier to the desired reference voltage. The R-2R MDAC and R-2R back-DAC each include a switch for each bit in the digital representation of an analog output, such that the analog output may be constructed by closing the switches (e.g., the poles of the switch are connected). The string DAC is configured to include $2^N-1$ (N being the number of bits of the DAC accuracy and the number of resistors in the resistor circuit) number of switches, such that any voltage generated by any combination of resistors in the resistor circuit may be coupled to an input of the amplifier. A DAC channel may utilize an IDAC and/or a VDAC to source current, sink current, or produce an output voltage in response to a digital input.

Examples described herein include example bi-directional IDAC circuitry. In operation, the total current the bi-directional IDAC may source and/or sink is based on the current sourced by a first driver minus the current sunk by a second driver. In the examples disclosed herein, the bi-directional IDAC may utilize transistors to control an amount of current sunk and/or sourced to generate the desired current. In some described examples, the IDAC may utilize the architecture (such as DAC ladder, decoding logic, etc.) of a VDAC to produce the output current. Advantageously, the disclosed IDAC shares the architecture of the VDAC to enable a DAC channel to have a voltage output or a current output in a physically compact package. Advantageously, the example IDACs described herein may use a sink current and/or a source current to reduce the power consumption, enable bi-directional operation, and unipolar operation on the same IDAC circuitry.

Figure 1:
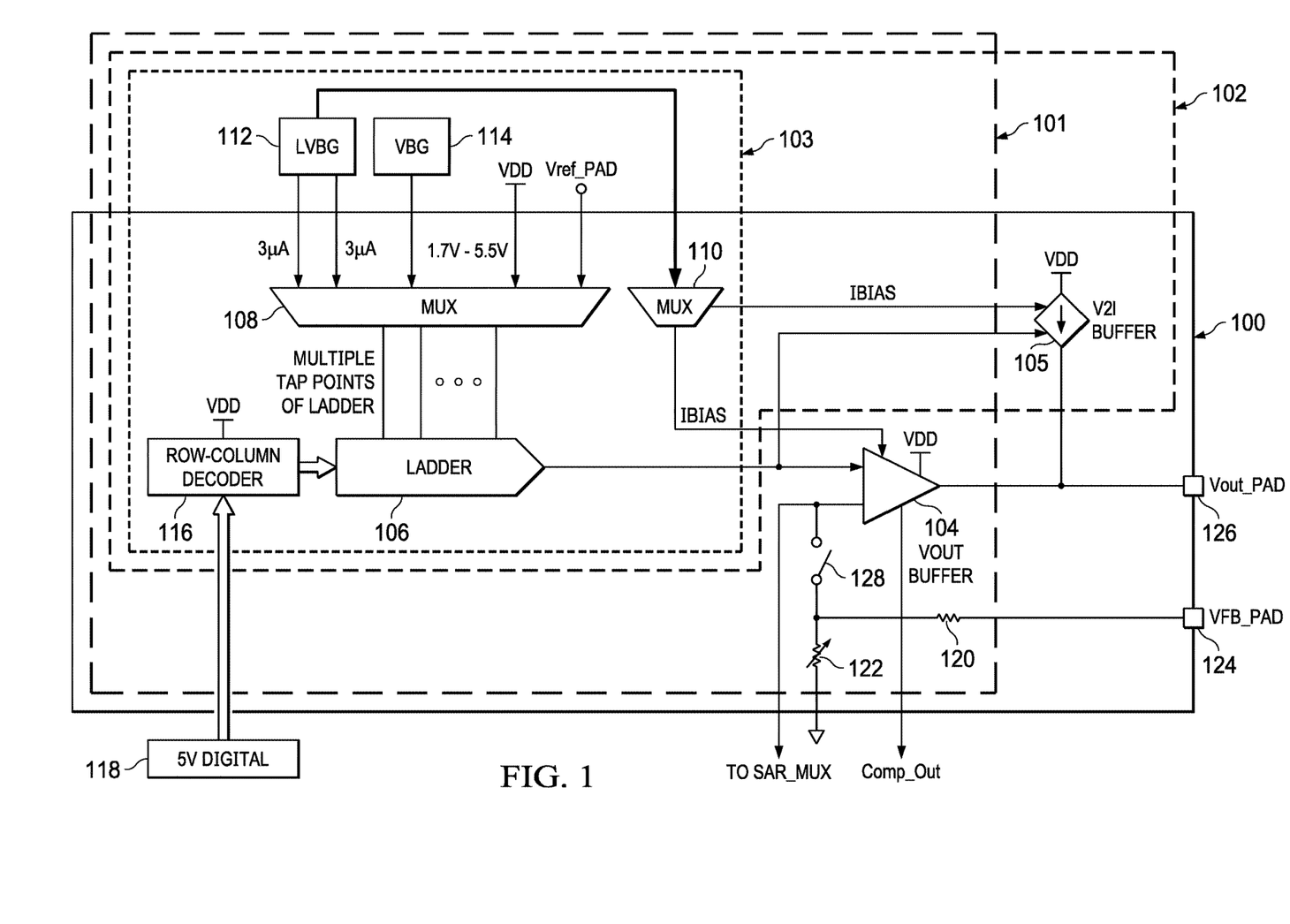
FIG. 1 is a schematic diagram of an example unified voltage output DAC (VDAC) and an example current output DAC (IDAC).

FIG. 1 is a schematic diagram of an example DAC channel 100 including an example VDAC 101, an example IDAC 102, and a DAC core 103. The DAC channel 100 is configured to generate a voltage output by configuring the DAC core 103 to enable an example voltage buffer (e.g., VOUT Buff) 104. The DAC channel 100 is configured to generate a current by configuring the DAC core 103 to enable an example voltage-to-current buffer (V2I Buffer) 105.

In the example of FIG. 1, the DAC core 103 includes an example digital-to-analog converter ladder 106 (ladder), a first example multiplexer (MUX) 108, a second example MUX 110, an example low voltage bandgap (LVBG) source 112, an example voltage bandgap (VBG) source 114, and an example row-column decoder 116. A DAC code input of the DAC core 103 is coupled to an example digital driver (e.g., 5V digital) 118. The DAC core 103 is included in the IDAC 102 and VDAC 101 to reduce the DAC channel 100 silicon/package size, while still allowing the DAC Channel 100 to provide VDAC and IDAC functionality.

The first MUX 108 may be configured to couple the DAC ladder 106 to one or more of inputs from the LVBG source 112, the VBG source 114, voltage source VDD, and/or an additional reference voltage. An output of the first MUX 108 is coupled to a first input of the DAC ladder 106. The first MUX 108 is configured to couple different inputs of the first MUX 108 to the outputs of the first MUX 108 based on the desired output (current output or voltage output) of the DAC channel 100.

A second input of the DAC ladder 106 is coupled to the output of the row-column decoder 116. The row-column decoder 116 is configured to enable the portions of the DAC ladder 106, such that an output of the DAC ladder 106 corresponds to the DAC code provided by the digital driver 118. For example, if the digital driver 118 is providing the row-column decoder 116 a digital value representing mid-code (the DAC code corresponding to an output halfway between the minimum output and the maximum output), the row-column decoder 116 is configured to enable the portions of the DAC ladder 106 that enable the output to be halfway between the minimum and the maximum output. The output of the DAC ladder 106 is configured as a DAC core output. The DAC code output of the digital driver 118 represents a digital version of the desired analog current or voltage.

The DAC code output of the digital driver 118 may be configured to adjust for errors (e.g., offset errors, gain errors, etc.) by adding additional bits to the desired DAC code. An example DAC code output (DAC_Code$_{Final}$) of the digital driver 118 may be configured to adjust for offset error contributions (DAC_Code$_{offset}$), uncorrelated gain error contributions (GTC$_{unCorr}$), and correlated gain error contributions (GTC$_{Corr}$) by adjusting the originally desired DAC code (DAC_CODE). The digital driver may account for end point errors (e.g., gain error, offset error, etc.) by performing calculations adjusting the DAC code output based on values determined during manufacturing and/or operation of the IDAC 102. The DAC_Code$_{Offset}$ is the difference between the IDAC 102 output at mid-code and approximately zero current output. The DAC_Code$_{Offset}$ may be determined during the manufacturing of the IDAC 102. GTC$_{Corr}$ and GTC$_{unCorr}$ adjust for variation in the supply voltage of the DAC ladder 106 (supplied by the first MUX 108). Variation in the supply voltage of the DAC ladder 106 may be a result of temperature, supply and/or process variations. The DAC_Code$_{Final}$ is equal to DAC_Code$_{offset}$ plus DAC_CODE plus the multiplication of the addition of GTC$_{Corr}$ and GTC$_{unCorr}$ and the division of DAC_CODE by the maximum output DAC code (FULL_CODE). The adjusted DAC code output of the digital driver 118 may be determined for any DAC code by $$\text{DAC\_Code}_{Final} = \text{DAC\_Code}_{Offset} + \{GTC_{Corr} + GTC_{unCorr}\} * \frac{\text{DAC\_CODE}}{\text{FULL\_CODE}} + \text{DAC\_CODE} \quad (1)$$

Alternatively, the row-column decoder 116 may be configured to perform the calculations represented by the equation above. Advantageously, adjusting the DAC code output of the digital driver 118 enables the row-column decoder to enable the DAC ladder 106, such that offset and gain error are minimized. Advantageously, implementing the equation above enables a reduced precision DAC ladder to be implemented without reducing accuracy.

The row-column decoder 116 is a decoder configured to enable any number of outputs based on the input. The row-column decoder 116 may be configured as a look-up-table (LUT), such that the DAC code output of the digital driver 118 is used to access a location in the LUT corresponding to a state of the switches comprised in the DAC ladder. The row-column decoder 116 may enable the outputs based on an approximation of the value as a result of an input being a value that may not be represented exactly by the IDAC 102. The row-column decoder 116 is configured to decode the DAC code output of the digital driver 118, such that the output of the DAC ladder 106 is within one least significant bit of the desired output. Alternatively, the row-column decoder 116 may be replaced with computer memory, demultiplexing circuitry, look-up-table (LUT) etc. The outputs of the row-column decoder 116 are coupled to switches configured to enable different resistor portions of the DAC ladder 106 to contribute to the output of the DAC ladder 106 coupled to a voltage buffer input of the V2I buffer 104. The DAC ladder 106 is the resistor circuit and plurality of switches of a string DAC, while the V2I buffer 105 is the amplifier of the string DAC. Alternatively, the DAC ladder 106 may be implemented as the resistor circuit and plurality of switches of another type of DAC (e.g., R-2R back-DAC, R-2R MDAC).

The row-column decoder 116 is configured to control a plurality of switches included in the DAC ladder 106. A string DAC (which may be used to implement DAC ladder 106) is configured to include $2^N-1$ (N being the number of bits of the DAC accuracy and the number of resistors in the resistor circuit) number of switches, such that any voltage generated by any combination of resistors in the resistor circuit may be coupled to the voltage buffer input of the V2I buffer 105 and the voltage buffer 104. The row-column decoder 116 determines the switches within the DAC ladder 106 to enable such that the output is approximately an analog representation of the DAC code output of the digital driver. Alternatively, the row-column decoder 116 may be removed or replaced with simpler decoding structure as a result of implementing another type of DAC ladder (e.g., R-2R MDAC, R-2R back-DAC). Alternatively, the DAC ladder 106 may be the resistor circuit and the plurality of switches from a string DAC and the V2I Buffer 104 may be configured as the amplifier.

In the example of FIG. 1, the VDAC 101 includes the DAC ladder 106, the first MUX 108, the second MUX 110, the VBG 114, the row-column decoder 116, the digital driver 118 provided by the DAC core 103. The VDAC 101 also includes the voltage buffer 104, an example resistor 120, a first example variable resistor 122, an example feedback output voltage terminal (VFB_PAD) 124, an example output terminal (Vout_PAD) 126, and a first example switch 128.

In the example of FIG. 1, an output of the VBG 114 is coupled to a first input of the first MUX 108. An output of the first MUX 108 is coupled to a first input of the DAC ladder 106. A second input of the DAC ladder 106 is coupled to an output of the row-column decoder 116. An input of the row-column decoder 116 is coupled to a DAC code output of the digital driver 118. A ladder output of the DAC ladder 106 is coupled to a first input of the voltage output buffer 104. A second input of the voltage buffer 104 is coupled to an output of the second MUX 110. The first switch 128 is coupled between the third input of the voltage buffer 104 and the resistor 120. The first switch 128 is coupled between the third input of the voltage buffer 104 and the first variable resistor 122. The resistor 120 is coupled between the feedback output terminal 124 and the first switch 128. A voltage buffer output of the voltage buffer 104 is coupled to the output terminal 126.

The DAC ladder 106 is configured to supply a reference voltage to the input of the voltage buffer 104 based on the DAC code output of the digital driver 118. The DAC ladder 106 is configured to operate similarly as a resistor circuit and plurality of switches of a string DAC. The row-column decoder 116 determines and enables the switches coupled to the resistor circuit, such that the output of the DAC ladder 106 may be an analog voltage representation of the DAC code output of the digital driver 118. The voltage buffer 104 may be configured as the amplifier in the string DAC, such that the combination of the voltage buffer 104 and the DAC ladder 106 may be replaced with a string DAC. The voltage buffer 104 may adjust for offset error by adjusting the variable resistor 122 and closing the switch 128, such that the voltage buffer 104 may be offset by the voltage drop across the variable resistor 122. The voltage buffer 104 may be configured as a closed-loop amplifier by coupling the feedback voltage output terminal 124 to the voltage output terminal 126 and closing the switch 128. In closed-loop operation of the voltage output buffer 104, the resistor 120 may be set to a magnitude that adjusts the voltage to account for process or offset errors. Alternatively, the DAC channel 100 may be configured only for closed-loop operation, by internally coupling the feedback voltage output terminal 124 to the voltage output terminal 126.

In the example of FIG. 1, the IDAC 102 includes the DAC ladder 106, the first MUX 108, the second MUX 110, the LVBG source 112, the row-column decoder 116, the digital driver 118, and the output terminal 126 provided by the DAC core 103. The IDAC 102 also includes the V2I (voltage-to-current) buffer 105. An IDAC input is coupled to the DAC code output of the digital driver 118. An IDAC output is coupled the output of the V2I buffer 105.

A reference current output of the LVBG source 112 is coupled to a second input of the first MUX 108. An output of the first MUX 108 is coupled to a first input of the DAC ladder 106. A second input of the DAC ladder 106 is coupled to the output of the row-column decoder 116. An input of the row-column decoder 116 is coupled to the DAC code output of the digital driver 118. The ladder output of the DAC ladder 106 is coupled to a first input of the V2I buffer 105. The DAC ladder 106 is configured to supply a reference voltage to the input of the V2I buffer 105 based on the DAC code output of the digital driver 118. The V2I buffer 105 may be configured as the amplifier in the string DAC. The V2I buffer 105 is configured to convert the voltage generated by the DAC ladder 106 into a current representing the DAC code output of the digital driver 118. A second input of the V2I buffer 105 is coupled to an output of the second MUX 110. An input of the second MUX 110 is coupled to a first output of the LVBG source 112. The output of the V2I buffer 105 is coupled to the output terminal 126. In some examples, the DAC channel 100 may consist of the IDAC 102 and/or the VDAC 101.

In some examples, the DAC channel 100 is a single integrated circuit (IC) (such as circuitry implemented on a single semiconductor die or on multiple die but within a single IC package). For example, the voltage buffer 104 and the V2I buffer 105 may be included on the same semiconductor die. In some examples, the DAC channel 100 may be implemented by two or more ICs in a single IC package to implement a multi-chip module (MCM). In some examples, the DAC channel 100 may be implemented by two or more ICs (such as two or more IC packages). For example, the voltage buffer 104 may be on a first die and the V2I buffer 105 may be on a second die. In some examples, the voltage buffer 104 may be on a first die, the V2I buffer 105 may be on a second die, and the DAC ladder 106 and the row-column decoder 116 may be on a third die. Alternatively, one or more hardware circuit components (such as the first MUX 108, the second MUX 110, the LVBG source 112, etc.) of the current digital-to-analog converter may be included in the voltage digital-to-analog converter. Alternatively, one or more hardware circuit components (such as the first MUX 108, the second MUX 110, the LVBG source 112, etc.) of the VDAC 101 may be included in the IDAC 102.

In example IDAC 102 operation, the row-column decoder 116 enables the portions of the DAC ladder 106 corresponding to the DAC code output of the digital driver 118. The row-column decoder 116 is configured to enable the portions of the DAC ladder 106, such that the analog output of the DAC ladder 106 corresponds to the DAC code provided by the digital driver 118. The DAC code output of the digital driver 118 represents a digital version of the desired analog current or voltage.

The first MUX 108 may configure the DAC channel 100 to output a current by coupling the LVBG source 112 to the DAC ladder 106. Based on a control signal (not shown) supplied to MUX 110, the LVBG source 112 is configured to supply a current (e.g., IBIAS) to the DAC ladder 106 and the V2I buffer 105, such that the DAC ladder 106 and the V2I buffer 105 are biased by the same current. The LVBG source 112 is used as the primary reference source during the IDAC 102 operation. The first MUX 108 may couple the LVBG source 112 to a plurality of different points on the DAC ladder 106, such that the precision of the DAC ladder 106 may be altered. The V2I buffer 105 is configured to convert an input voltage from the DAC ladder 106 and an input current from the LVBG source 112 into a current (which is a current representation of the DAC code output of the digital driver 118). Advantageously, the first MUX 108 is coupled to the LVBG source 112 to reduce linearity errors and end point errors. Advantageously, the offset error caused by the LVBG source 112 is reduced as a result of being coupled to the DAC ladder 106 and an input of the V2I buffer 105, such that the currents supplied track each other across process, voltage, and temperature variations.

In example VDAC 101 operation, the row-column decoder 116 enables the portions of the DAC ladder 106 corresponding to the DAC code output of the digital driver 118. As discussed above, the row-column decoder 116 is configured to enable the portions of the DAC ladder 106, such that the analog output of the DAC ladder 106 corresponds to the DAC code provided by the digital driver 118. The first MUX 108 may configure the DAC channel 100 to output a voltage by coupling the VBG 114 to the DAC ladder 106.

The DAC ladder 106 is configured to supply a reference voltage to the input of the voltage buffer 104 based on the DAC code output of the digital driver 118. The voltage output buffer 105 may adjust for offset error by adjusting the variable resistor 122 and closing the switch 128. The voltage buffer 104 may be configured as a closed-loop amplifier by coupling the feedback voltage output terminal 124 to the voltage output terminal 126 and closing the switch 128. In closed-loop operation of the voltage output buffer 104, the resistor 120 may be set to a magnitude that adjusts the voltage to account for process or offset errors. Alternatively, the DAC channel 100 may be configured to only closed-loop operation, by internally coupling the feedback voltage output terminal 124 to the voltage output terminal 126.

In example operation, both the voltage buffer 104 and the V2I buffer 105 are configured to provide an analog representation of the DAC code output of the digital driver 118. The DAC channel 100 includes a voltage output mode and a current output mode. The current output mode corresponds to IDAC 102 operation wherein the DAC ladder is coupled to the LVBG source 112 through the first MUX 108. The voltage output mode corresponds to the VDAC 101 operation wherein the DAC ladder is coupled to the VBG source 114. The DAC channel 100 may be configured (e.g., during manufacture of DAC channel 100, during final testing of DAC channel 100 or during operation of DAC channel 100 by an internal or external circuit, such as a controller, processor, analog circuitry, digital circuitry and/or any combination thereof) to voltage output mode or current output mode, however both the voltage buffer 104 and the V2I buffer 105 may both be enabled. Advantageously, the first MUX 108 is able to determine if the LVBG source 112 or the VBG 114 supplies the DAC ladder 106, further reducing the silicon/package size of the DAC channel 100. Advantageously, the output of the V2I buffer 105 and the output of voltage buffer 104 are both coupled to the output terminal 126 thereby enabling the DAC channel 100 to switch between the output current mode and the output voltage mode.

Figure 2:
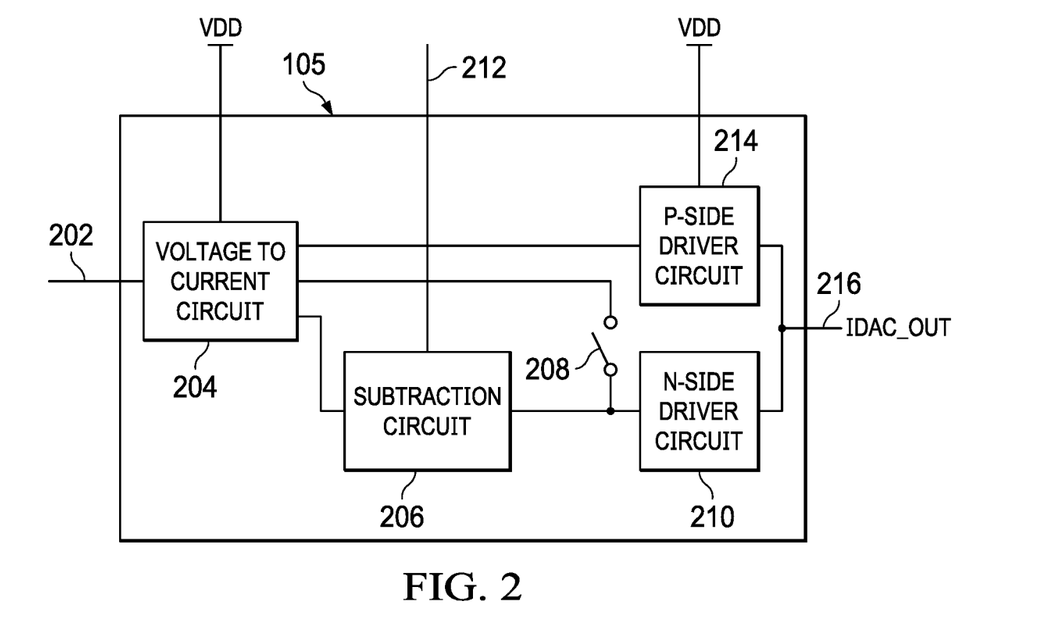
FIG. 2 is a block diagram of an example implementation of the IDAC of FIG. 1.

FIG. 2 is a block diagram of example implementation of the V2I buffer 105 of FIG. 1. In the example of FIG. 2, the V2I buffer 105 includes a first example input 202, an example voltage-to-current circuit 204, an example subtraction circuit 206, a second example switch 208, a first example driver circuit 210, a second example input 212, a second example driver circuit 214, and an example output current terminal 216.

The first input 202 of the V2I buffer 105 may be coupled to the output of the DAC ladder 106 of FIG. 1. The second input 212 of the V2I buffer 105 may be coupled to the output of the second MUX 110 of FIG. 1 or directly to the LVBG source 112 of FIG. 1. The first input 202 is coupled to an input of the voltage-to-current circuit 204. A first output of the voltage-to-current circuit 204 is coupled to an input of the subtraction circuit 206. The second input 212 is coupled to the subtraction circuit 206. A first terminal of the second switch 208 is coupled to an output of the subtraction circuit 206. A second terminal of the second switch 208 is coupled to a second output of the voltage-to-current circuit 204. An output of the first driver circuit 210 is coupled to the output current terminal 216. A third output of the voltage-to-current circuit 204 is coupled to the second driver circuit 214. An output of the second driver circuit 214 is coupled to the output current terminal 216.

In example bipolar operation, the first input 202 is a voltage representation of the DAC code. The voltage-to-current circuit 204 converts the voltage representation of the DAC code, from the first input 202, into a converted current. The subtraction circuit 206 may subtract the converted current from the second input 212 to generate a driver current. The first driver circuit 210 may be configured to sink current from the output current terminal 216 based on the driver current. The second driver circuit 214 may source current to the output current terminal 216 as a result of receiving a current from the voltage-to-current circuit 204.

In example unipolar operation, the first input 202 is a voltage representation of the DAC code. The voltage-to-current circuit 204 converts the voltage representation of the DAC code, from the first input, into a driver current. The first driver circuit 210 may be configured to sink current from the output current terminal 216 based on the driver current. The second driver circuit 214 and subtraction circuit 206 remain disabled during negative unipolar mode (e.g., current is only being sunk by the first driver circuit 210). The first driver circuit 210 is disabled during positive unipolar operation (e.g., current is only being sourced by the second driver circuit 214).

Advantageously, the V2I buffer 105 may enable and control the first driver circuit 210 and the second driver circuit 214 together to adjust for a bi-directional current source coupled to the output current terminal 216. Advantageously, the second switch 208 may connect the first driver circuit 210 to the second output of the voltage-to-current circuit 204 during negative unipolar operation to reduce power consumption by disabling the subtraction circuit 206. Advantageously, the second driver circuit 214 and the voltage-to-current circuit 204 may be enabled to adjust for positive unipolar operation.

Figure 3:
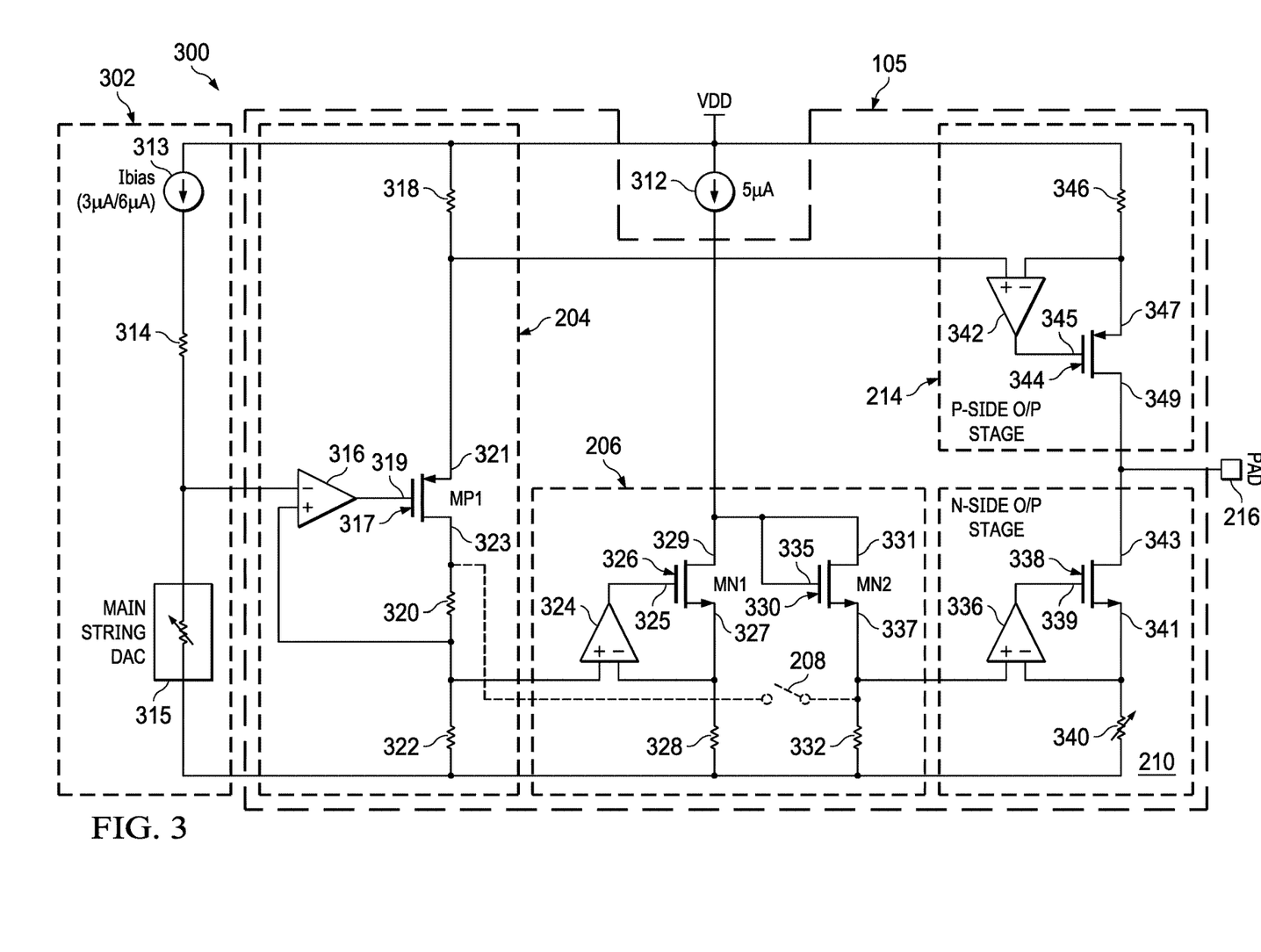
FIG. 3 is a schematic diagram of an example implementation of the IDAC of FIG. 2.

FIG. 3 is a schematic diagram of example implementation of an example IDAC 300.

In the example of FIG. 3, the IDAC 300 includes the V2I buffer 105, the voltage RDAC 302, and an example bias current source 312. The V2I buffer 105 includes the voltage-to-current circuit 204, the subtraction circuit 206, the first driver circuit 210, the second driver circuit 214, and the output current terminal 216.

In the example of FIG. 3, the voltage RDAC 302 includes an example low voltage bandgap (LVBG) source 313, a first example resistor 314, and an example DAC ladder 315 (such as a string DAC). The first resistor 314 is coupled between the LVBG source 313 and the DAC ladder 315. A VDAC output of the voltage RDAC 302 is coupled between the first resistor 314 and the DAC ladder 315. Alternatively, the LVBG source 313 may be replaced by the LVBG source 112 of FIG. 1. Alternatively, the DAC ladder 315 may be replaced by the DAC ladder 106 of FIG. 1, a resistor circuit of a R-2R MDAC, or a resistor circuit of a R-2R back-DAC.

In the example of FIG. 3, the voltage-to-current circuit 204 includes a first example amplifier 316, a first example transistor 317, a second example resistor 318, a third example resistor 320, a fourth example resistor 322. The first transistor 317 is a metal-oxide semiconductor field-effect transistor (MOSFET). Specifically, first transistor 317 is a p-channel MOSFET (pMOSFET). Alternatively, the first transistor 317 may be a p-channel field-effect transistor (FET), a p-channel insulated-gate bipolar transistor (IGBT), a p-channel junction field effect transistor (JFET), or an PNP bipolar junction transistor (BJT). A gate terminal of a transistor may be referred to as a control terminal. A source terminal or a drain terminal may be referred to as a current terminal.

A first amplifier input (e.g., a non-inverting input of an operational amplifier) of the first amplifier 316 is coupled to the VDAC output of the voltage RDAC 302. An output of the first amplifier 316 is coupled to a control terminal 319 of the first transistor 317. The second resistor 318 is coupled between a first current terminal 321 (e.g. a source) of the first transistor 317 and voltage source VDD. The third resistor 320 is coupled between a second current terminal 323 (e.g., a drain) of the first transistor 317 and the fourth resistor 322. The fourth resistor 322 is coupled between the third resistor 320 and the common potential (e.g., ground). A second input (e.g., an inverting input of an operational amplifier) to the first amplifier 316 is coupled between resistors 320 and 322.

In the example of FIG. 3, the subtraction circuit 206 includes the second switch 208, a second example amplifier 324, a second example transistor 326, a fifth example resistor 328, a third example transistor 330, and a sixth example resistor 332. The second transistor 326 is an n-channel MOSFET (nMOSFET). Alternatively, the second transistor 326 may be an n-channel FET, an n-channel IGBT, an n-channel JFET, or an NPN BJT. The third transistor 330 is an nMOSFET. Alternatively, the third transistor 330 may be a diode, an n-channel FET, an n-channel IGBT, an n-channel JFET, or an NPN BJT.

A first input (e.g., a non-inverting input of an operational amplifier) of the second amplifier 324 is coupled between resistors 320 and 322. An output of the second amplifier 324 is coupled to a control terminal 325 of the second transistor 326. The fifth resistor 328 is coupled between a first current terminal 327 (e.g., a source) of the second transistor 326 and the common potential (e.g., ground). A second input (e.g., an inverting input of an operational amplifier) of the second amplifier 324 is coupled between the first current terminal 327 of the second transistor 326 and the fifth resistor 328. A second current terminal 329 (e.g., a drain) of the second transistor 326 is coupled to an output of the bias current source 312. A first current terminal 331 (e.g., a drain) of the third transistor 330 is coupled between the output of the bias current source 312 and the second current terminal 329 of the second transistor 326. The first current terminal 331 of the third transistor 330 is coupled to a control terminal 335 (e.g., a gate) of the third transistor 330. The second switch 208 is coupled between a second current terminal 337 (e.g., a source) of the third transistor 330 and the second current terminal 323 of the first transistor 317. The sixth resistor 332 is coupled between the second current terminal 337 of the third transistor 330 and common potential (e.g., ground).

In the example of FIG. 3, the first driver circuit 210 includes a third example amplifier 336, a fourth example transistor 338, and a second example variable resistor 340. The fourth transistor 338 is an nMOSFET. Alternatively, the fourth transistor 338 may be an n-channel FET, an n-channel IGBT, an n-channel JFET, or an NPN BJT. The second variable resistor 340 may be a multiplexer with different resistances for each output or another resistor ladder.

In the example of FIG. 3, a first input of the third amplifier 336 is coupled between the second current terminal 337 of the third transistor 330 and the sixth resistor 332. An output of the third amplifier 336 is coupled to a control terminal 339 of the fourth transistor 338. The second variable resistor 340 is coupled between a first current terminal 341 of the fourth transistor 338 and common potential (e.g., ground). A second input of the third amplifier 336 is coupled between the first current terminal 341 of the fourth transistor 338 and the second variable resistor 340. A second current terminal 343 of the fourth transistor 338 is coupled to the output current terminal 216.

In the example of FIG. 3, the second driver circuit 214 includes a fourth example amplifier 342, a fifth example transistor 344, and a third example variable resistor 346. The fifth transistor 344 is a pMOSFET. Alternatively, the fifth transistor 344 may be a p-channel FET, a p-channel IGBT, a p-channel JFET, or an PNP BJT. The third variable resistor 346 may be a multiplexer with different resistances for each output or another resistor ladder.

A first input (e.g., a non-inverting input of an operational amplifier) of the fourth amplifier 342 is coupled between the second resistor 318 and the first current terminal 321 of the first transistor 317. An output of the fourth amplifier 342 is coupled to a control terminal 345 (e.g., a gate) of the fifth transistor 344. The third variable resistor 346 is coupled between a first current terminal 347 (e.g., a source) of the fifth transistor 344 and voltage source VDD. A second input (e.g., an inverting input of an operational amplifier) of the fourth amplifier 342 is coupled between the first current terminal 347 of the fifth transistor 344 and the third variable resistor 346. A second current terminal 349 (e.g., a drain) of the fifth transistor 344 is coupled to the output current terminal 216.

In some examples, the IDAC 200 is a single integrated circuit (IC) (such as circuitry implemented on a single semiconductor die or on multiple die but within a single IC package). For example, the voltage-to-current circuit 204 and the subtraction circuit 206 may be included on the same semiconductor die. In some examples, the IDAC 200 may be implemented by two or more ICs in a single IC package to implement a multi-chip module (MCM). In some examples, the IDAC 200 may be implemented by two or more ICs (such as two or more IC packages). For example, the voltage-to-current circuit 204 may be on a first die and the subtraction circuit 206 may be on a second die. In some examples, the voltage-to-current circuit 204 may be on a first die, the subtraction circuit 206 may be on a second die, and the first driver circuit 210 and the second driver circuit 214 may be on a third die. Alternatively, one or more hardware circuit components (such as the first amplifier 316, the first transistor 317, the second resistor 318, etc.) of the voltage-to-current circuit 204 may be included in the first driver circuit 210. Alternatively, one or more hardware circuit components (such as the second amplifier 324, the second transistor 326, the third transistor 330, etc.) of the subtraction circuit 206 may be included in the first driver circuit 210.

In example operation, there are three potential configurations the IDAC (such as IDAC 200) may take: a bi-directional configuration, a positive unipolar configuration, and a negative unipolar configuration. In the bi-directional configuration, the voltage-to-current circuit 204, the subtraction circuit 206, the first driver circuit 210, and the second driver circuit 214 are enabled. In the bi-directional configuration, the second switch 208 is open. In the positive unipolar configuration, the voltage-to-current circuit 204 and the second driver circuit 214 are enabled, while the subtraction circuit 206 and the first driver circuit 210 are disabled. In the negative unipolar configuration, the voltageto-current circuit 204 and the first driver circuit 210 are enabled, while the subtraction circuit 206 and the second driver circuit 214 are disabled. In negative unipolar configuration, the second switch 208 couples the first input of the third amplifier 336 to the second current terminal 323 of the first transistor 317. Advantageously, the negative unipolar configuration reduces the power consumption of the IDAC 200 by disabling the subtraction circuit 206.

In example bi-directional operation, the first amplifier 316 may enable the first transistor 317 based on the VDAC output of the voltage RDAC 302. The current flowing through the second resistor 318 is represented in the equations below by the variable $I_c$. The first amplifier 316 may contribute an additional current to the output of the voltage-to-current circuit 204 represented in the equations below by the variable $I_{dac}$. The current flowing through the first transistor 317 is represented in the equations below by the variable $I_1$. In some examples, the first transistor 317 may be enabled to operate based on $$I_1 = I_C + I_{dac} \quad (2)$$

The second amplifier 324 is configured to enable the second transistor 326 based on the voltage between resistors 320 and 322. The current passing through the third transistor 330 is represented in the equations below by the variable $I_2$. The current generated by the bias current source 312 is represented in the equations below by the variable $I_{C1}$. In some examples the current flowing through the third transistor 330 may be based on $$I_2 = I_{C1} - I_C - I_{dac} \quad (3)$$

The current flowing through the third transistor 330 prevents the collapse of the drain-to-source voltage ($V_{DS}$) of the second transistor 326. The third transistor 330 is configured as a diode. The current passing through the fourth transistor 338 is represented in the equations below by the variable $I_N$. The second variable resistor 340 may be set to a resistance value that enables $I_N$ to have a gain represented in the equations below by the variable K. In some examples $I_N$ may be determined by $$I_N = -K^*(I_{C1} - I_C - I_{dac}) \quad (4)$$

The current passing through the fifth transistor 344 is represented in the equations below by the variable $I_P$. The third variable resistor 346 may be set to a resistance value that enables $I_P$ to have a gain represented by the variable K. In some examples $I_P$ may be determined by $$I_P = K^*(I_C + I_{dac}) \quad (5)$$

The current supplied to the output current terminal 216 is represented in the equations below by the variable $I_{OUT}$. In some examples $I_{OUT}$ may be determined, for any DAC code, by $$I_{OUT} = K^*(2^*I_C + 2^*I_{dac} - I_{C1}) \quad (6)$$

In the example positive unipolar configuration, the first driver circuit 210 is disabled and the second driver circuit 214 is enabled, resulting in $I_{OUT} = I_P$. In some examples $I_{OUT}$ may be determined, for any DAC code, by $$I_{OUT} = K^*(I_C + I_{dac}) \quad (7)$$

In the example negative unipolar configuration, the first driver circuit 210 is enabled and the second driver circuit 214 is disabled, resulting in $I_{OUT} = I_N$. In some examples $I_{OUT}$ may be determined, for any DAC code, by $$I_{OUT} = -K^*(I_C + I_{dac}) \quad (8)$$

In example operation, the first driver circuit 210 is configured to use the output of the subtraction circuit 206 to determine the amount of current to sink from the output current terminal 216. The first driver circuit 210 may sink current during the bi-directional and negative unipolar configurations. The second driver circuit 214 is configured to source current from the voltage source VDD coupled to the third variable resistor 346. The second driver circuit may source current during the bi-directional and positive unipolar configurations. In the example of FIG. 3, approximate example current values depicted in FIG. 3 may differ from one design to the next. For example, the bias current source 312 is depicted in FIG. 3 to output 5 micro amps (μA). Alternatively, the bias current source 312 may be designed to output any value (because, for example, these example embodiments are scalable).

Advantageously, the output current terminal 216 of the IDAC 200 may be configured to source and/or sink current enabling bi-directional behavior for the output current terminal 216. Advantageously, during positive unipolar and negative unipolar configuration the second switch 208 disables the subtraction circuit 206 reducing the power consumption of the IDAC 200. Advantageously, the second variable resistor 340 and the third variable resistor 346 may be configured to adjust the output current terminal 216 supply by a gain factor. Advantageously, the first driver circuit 210 and the second driver circuit 214 may switch the output current terminal 216 eliminating a discontinuity in the IDAC linear characteristics. Advantageously, the LVBG source 313 enables the gain of the output current terminal 216 to minimize gain error.

Figure 4A:
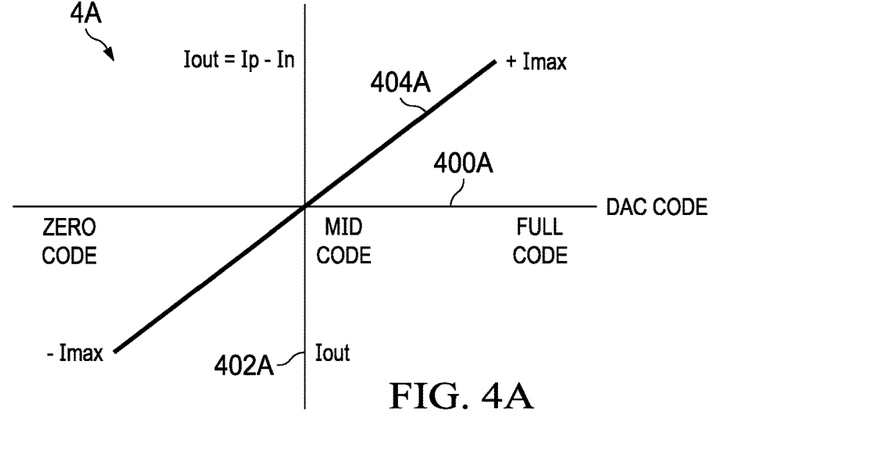
FIG. 4A is an example DAC code versus output load current plot for an example operation of the IDAC of FIG. 3.
Figure 4B:
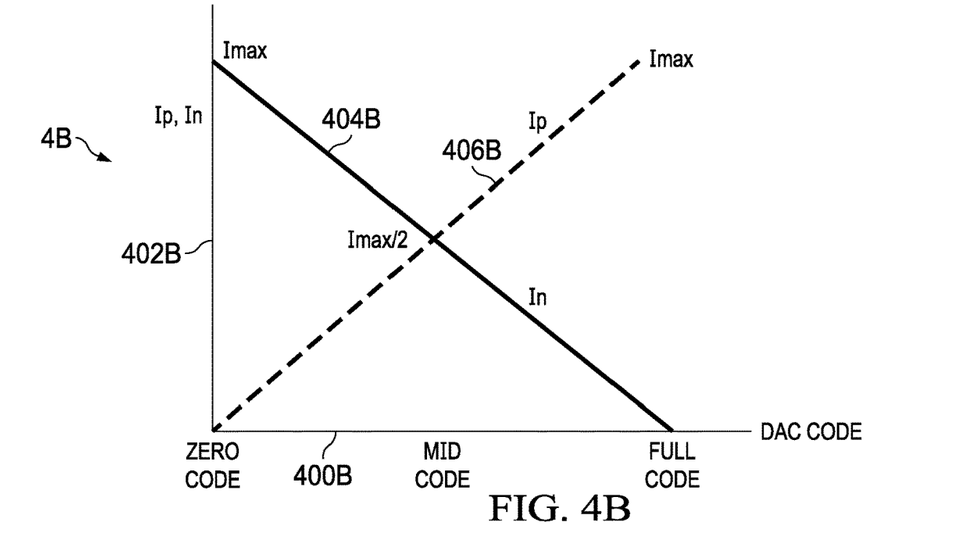
FIG. 4B is an example DAC code versus current through a driver circuit plot of the IDAC from FIG. 3.
Figure 4C:
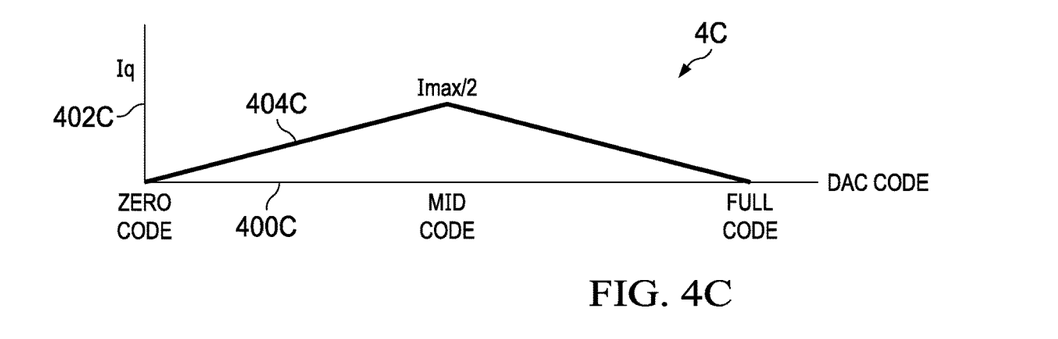
FIG. 4C is an example DAC code versus quiescent current plot of the IDAC from FIG. 3.

FIGS. 4A, 4B and 4C are three example DAC code versus current plots for an example operation of the IDAC 200 of FIG. 3. In the example of FIGS. 4A-4C, the three plots include an example DAC code versus an output current plot ($I_{OUT}$) 4A, an example DAC code versus the first driver sink current ($I_N$) and the second driver source current ($I_P$) plot 4B, and an example DAC code versus quiescent current ($I_q$) plot 4C.

The DAC code versus $I_{OUT}$ plot 4A includes an example DAC code axis 400A, an example $I_{OUT}$ axis 402A, and a first example line 404A. The DAC code axis 400A includes a range of values from zero code to full code. The first line 404A is linearly increasing from $-I_{MAX}$ at zero code to $I_{MAX}$ at full code.

The DAC code versus the first driver sink current ($I_N$) and the second driver source current ($I_P$) plot 4B includes an example DAC code axis 400B, an example $I_N$ and $I_P$ current axis 402B, an example $I_N$ line 404B, and an example $I_P$ line 406B. The DAC code axis 400B includes a range of values from zero code to full code. The $I_N$ line 404B decreases from $I_{MAX}$ at zero code to zero at full code. The $I_P$ line 406B increases from zero at zero code to $I_{MAX}$ at full code. The $I_N$ line 404B intersects the $I_P$ line 406B near mid code.

The DAC code versus quiescent current ($I_q$) plot 4C includes an example DAC code axis 400C, an example quiescent current axis 402C, and a second example line 404C. The DAC code axis 400C includes a range of values from zero code to full code. The second line 404C increases from zero at zero code to half of $I_{MAX}$ near mid code. The second line 404C decreases from half of $I_{MAX}$ near mid code to zero at full code.

In the example of the DAC code versus $I_{OUT}$ plot 4A, the first line 404A exhibits how the DAC code provided to the DAC channel 100 of FIG. 1 effects the output current ($I_{OUT}$) of the IDAC 200 of FIG. 3. The value of $I_{OUT}$ is determined as $I_P$ minus $I_N$ ($I_{OUT} = I_P - I_N$). The current of the first line 404A may be between $-I_{MAX}$ and $I_{MAX}$, such that negative current indicates the sinking of the output current through the IDAC 200 of FIGS. 2 and 3.

In the example of the DAC code versus the first driver sink current ($I_N$) and the second driver source current ($I_P$) plot 4B, the line 404B demonstrates the operation of the first driver circuit 210 of FIGS. 2 and 3. The first driver circuit 210 of FIGS. 2 and 3 sinks current from the output current terminal 216 of FIGS. 2 and 3 to common potential (e.g., ground). The line 404B includes a range of zero to $I_{MAX}$ wherein $I_N$ is the current being sunk by the first driver circuit 210 of FIGS. 2 and 3. The line 406B demonstrates the operation of the second driver circuit 214 of FIGS. 2 and 3. The second driver circuit 214 of FIGS. 2 and 3 sources current to the output current terminal 216 of FIGS. 2 and 3 from the voltage supply VDD. The $I_P$ line 406B includes a range of zero to $I_{MAX}$. where $I_P$ is the current being sourced by the second driver circuit 214 of FIGS. 2 and 3. In the example DAC code versus an output current plot ($I_{OUT}$) 4A, the line 404B, and the line 406B are continuous for all DAC codes.

In the example of the DAC code versus the quiescent current ($I_q$) plot 4C, the line 404C demonstrates the current consumed internally by the components of the IDAC 200 of FIGS. 2 and 3. The line 404C includes values from zero to half of $I_{MAX}$. As the quiescent current increases so does the power consumption of the IDAC 200 of FIGS. 2 and 3. At mid code the first driver circuit 210 of FIGS. 2 and 3 is sinking approximately half of $I_{MAX}$, whereas the second driver circuit 214 of FIGS. 2 and 3 is sourcing approximately half of $I_{MAX}$, making the most power consumed near mid code. At mid code, current is being sunk and sourced, such that all components of FIG. 3 are enabled. As the DAC code shifts further from mid code, less power is consumed by the components of IDAC 200 of FIGS. 2 and 3.

Figure 5A:
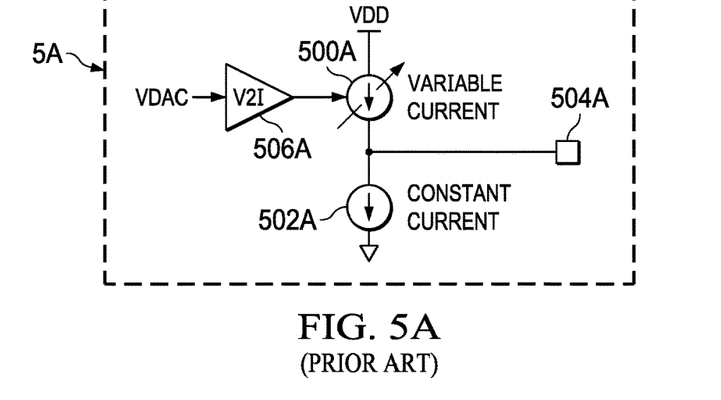
FIGS. 5A-5C are schematic diagrams of conventional IDACs.
Figure 5B:
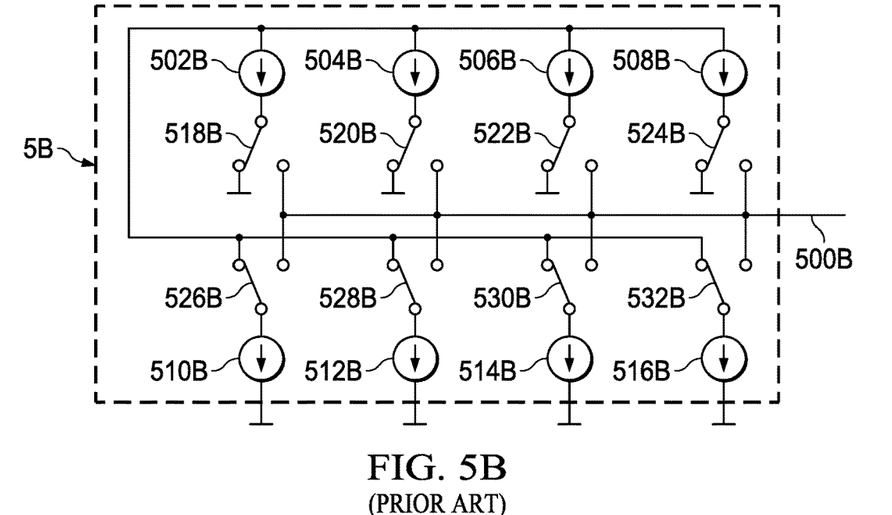
Figure 5C:
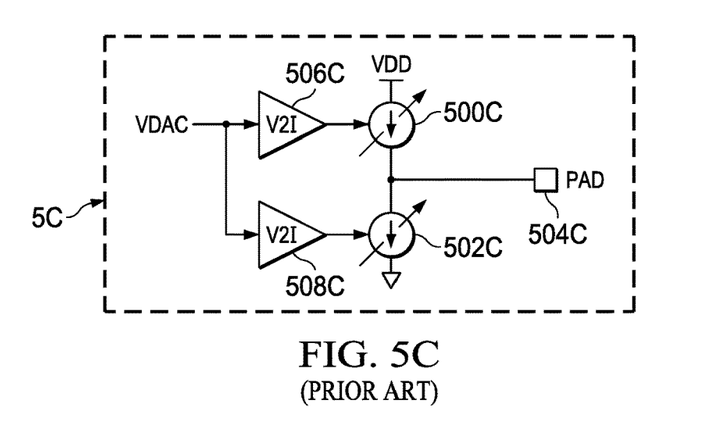

FIGS. 5A, 5B and 5C are three schematic diagrams of conventional current-digital-to-analog converters. In the example of FIGS. 5A-5C, the three conventional current-digital-to-analog converters include an example conventional bipolar IDAC 5A, an example conventional current steering IDAC 5B, and an example conventional low power bipolar IDAC 5C.

In the example of FIG. 5A, the conventional bipolar IDAC 5A includes a second example variable current source 500A, an example fixed current source 502A, a first output current terminal 504A, and an example conventional voltage-to-current (V2I) buffer 506A. The second variable current source 500A is coupled between the first output current terminal 504A and voltage source VDD. The second variable current source 500A is configured to source current to the first output current terminal 504A based on the conventional V2I buffer 506A. The fixed current source 502A is coupled between the first output current terminal 504A and common potential (e.g., ground). The fixed current source 502A is configured to sink current from the first output current terminal 504A. The conventional bipolar IDAC 5A may output a current based on the DAC code of the range zero code to full code.

In example operation, the conventional bipolar IDAC 5A may source or sink current from a load coupled to the first output current terminal 504A. The fixed current source 502A is configured to sink $I_{MAX}$ no matter the DAC code. The second variable current source 500A is configured to source current in the range of zero to two times $I_{MAX}$ based on the conventional V2I buffer 506A. The second variable current source 500A may be able to supply enough current to allow the conventional bipolar IDAC 5A to be able to supply from $-I_{MAX}$ to $I_{MAX}$ to the first output current terminal 504A. The conventional bipolar IDAC 5A includes a high-power consumption as a result of the current $I_{MAX}$ being sunk across all DAC codes, such that in order to supply a positive current to the first output current terminal 504A the current source must be larger than $I_{MAX}$.

In the example of FIG. 5B, the conventional current steering IDAC 5B includes a second example fixed current source 502B, a third example fixed current source 504B, a fourth example fixed current source 506B, a fifth example fixed current source 508B, a sixth example fixed current source 510B, a seventh example fixed current source 512B, an eighth example fixed current source 514B, a ninth example fixed current source 516B, a third example switch 518B, a fourth example switch 520B, a fifth example switch 522B, a sixth example switch 524B, a seventh example switch 526B, an eighth example switch 528B, a ninth example switch 530B, a tenth example switch 532B, and a second example output current terminal 500B. In some examples the switches may be implemented by a transistor. In the example of the conventional current steering IDAC 5B, the fixed current sources 502B-508B are configured to source current to the second output current terminal 500B, and the fixed current sources 510B-516B are configured to sink current from the second output current terminal 500B. The fixed current sources 508B and 510B provide a base current ($I_b$). The fixed current sources 506B and 514B provide a current of $2*I_b$. The fixed current sources 504B and 512B provide a current of $4*I_b$. The fixed current sources 502B and 510B provide a current of $8*I_b$.

The third switch 518B is coupled between the second fixed current source 502B and the second output current terminal 500B. The fourth switch 520B is coupled between the third fixed current source 504B and the second output current terminal 500B. The fifth switch 522B is coupled between the fourth fixed current source 506B and the second output current terminal 500B. The sixth switch 524B is coupled between the fifth fixed current source 508B and the second output current terminal 500B. The seventh switch 526B is coupled between the second output current terminal 500B and the sixth fixed current source 510B. The eighth switch 528B is coupled between the second output current terminal 500B and the seventh fixed current source 512B. The ninth switch 530B is coupled between the second output current terminal 500B and the eighth fixed current source 514B. The tenth switch 532B is coupled between the second output current terminal 500B and the ninth fixed current source 516B. The fixed current sources 502B-508B are coupled to source voltage VDD. The fixed current sources 510B-516B are coupled to common potential (e.g., ground).

In example operation, the conventional current steering IDAC 5B may source or sink current from the load coupled to the second output current terminal 500B. The conventional current steering IDAC 5B may be configured by a plurality of bits, such that each bit represents a switch. The conventional current steering IDAC 5B may combine fixed current sources (such as the second fixed current source 502B, the third fixed current source 504B, etc.) and sink fixed current sources (such as the sixth fixed current source 510B, the seventh fixed current source 512B, etc.) to generate current at the second output current terminal 500B. The combination of source and sink current sources often lead to power consumption issues.

In the example of FIG. 5C, the conventional low power bipolar IDAC 5C includes a third example variable current source 500C, a fourth example variable current source 502C, a third example output current terminal 504C, a second example conventional voltage-to-current buffer 506C, and a third example voltage-to-current buffer 508C. A first terminal of the third variable current source 500C is coupled to the third output current terminal 504C. A first terminal of the fourth variable current source 502C is coupled to the third output current terminal 504C. The second conventional voltage-to-current buffer 506C is coupled to the third variable current source 500C. The third conventional voltage-to-current buffer 508C is coupled to the fourth variable current source 502C. The third variable current source 500C configured to source current to the third output current terminal 504C. The fourth variable current source 502C configured to sink current form the third output current terminal 504C. The third variable current source 500C has a range of zero to $I_{MAX}$. The third variable current source 502C has a range of zero to $I_{MAX}$.

In example operation, the conventional low power bipolar IDAC 5C may use the third variable current source 500C to source current to the third output current terminal 504C based on the second conventional voltage-to-current buffer 506C. The fourth variable current source 502C may sink current from the third output current terminal 504C based on the third conventional voltage-to-current buffer 508C. The conventional low power bipolar IDAC 5C achieves the current output on the third output current terminal by sinking or sourcing current. The conventional low power bipolar IDAC 5C may control either the third variable current source 500C or the fourth variable current source 502C, such that the switch creates a discontinuity in the IDAC linear characteristics. The range of the conventional low power bipolar IDAC 5C is $I_{MAX}$ to $I_{MAX}$. In operation of the conventional low power bipolar IDAC 5C, a switch over point occurs between the sourcing of current from source 500C and the sinking of current from source 502C. This switch over point causes a discontinuity in the linearity of the conventional low power bipolar IDAC 5C. Due to this switch over point, the conventional low power bipolar IDAC 5C has higher linearity errors (such as integral non-linearity errors, INL, and differential non-linearity errors, DNL) and end point errors (such as gain errors and offset errors).

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" describes the structural and functional characteristics of one or more tangible non-transitory components. For example, a device that is "configured to" perform a function mean that the device has a particular configuration that is designed or dedicated for performing a certain function. A device is "configured to" perform a certain function if such a device includes tangible non-transitory components that can be enabled, activated, or powered to perform that certain function. While the term "configured to" may encompass being configurable, this term is not limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this does not require that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above does not require such separation in all embodiments.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While the example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

The following claims are hereby incorporated into this Detailed Description by this reference, with each claim standing on its own as a separate embodiment of the present disclosure.

What is claimed is:

1. An apparatus comprising:
    a voltage-to-current circuit including a first input terminal, a first output terminal and a second output terminal;
    a subtraction circuit including a second input terminal and a third output terminal, the second input terminal coupled to the second output terminal;
    a first driver circuit including a third input terminal and a fourth output terminal, the third input terminal coupled to the third output terminal; and
    a second driver circuit including a fourth input terminal and a fifth output terminal, the fourth input terminal coupled to the first output terminal, the fifth output coupled to the fourth output terminal.

2. The apparatus of claim 1, wherein the voltage-to-current circuit includes a transistor, wherein the transistor includes a current terminal coupled to the second output terminal through a resistor.

3. The apparatus of claim 1, wherein the subtraction circuit includes a diode.

4. The apparatus of claim 1, wherein the first driver circuit includes a n-channel metal-oxide semiconductor field-effect (MOSFET) transistor.

5. The apparatus of claim 4, wherein the first driver circuit includes an amplifier having an output terminal coupled to a control terminal of the n-channel metal-oxide semiconductor field-effect (MOSFET) transistor.

6. The apparatus of claim 1, wherein the first driver circuit includes a variable resistor coupled to an amplifier input.

7. The apparatus of claim 1, wherein the second driver circuit includes a p-channel metal-oxide semiconductor field-effect transistor.

8. The apparatus of claim 7, wherein the second driver circuit includes an amplifier having an output terminal coupled to a control terminal of the p-channel metal-oxide semiconductor field-effect transistor.

9. The apparatus of claim 1, wherein the second driver circuit includes a variable resistor coupled to an amplifier input.

10. A current digital-to-analog converter (IDAC) comprising:
    a digital-to-analog converter (DAC) core including a DAC output;
    a voltage output buffer including a first input and a first output, the first input is coupled to the DAC output; and
    a voltage-to-current buffer including a second input and a current output, the second input is coupled to the DAC output.

11. The IDAC of claim 10, wherein the DAC core includes:
    a digital-to-analog converter ladder including a ladder output coupled to the DAC output;
    a multiplexer coupled to the digital-to-analog converter ladder.

12. The IDAC of claim 11, wherein the multiplexer includes a first input for a low voltage bandgap source and a second input for a voltage bandgap (VBG) source.

13. The IDAC of claim 11, wherein the digital-to-analog converter ladder includes additional bits for error trimming.

14. The IDAC of claim 10, wherein the voltage output buffer includes a low voltage bandgap (LVBG) source coupled to a multiplexer.

15. The IDAC of claim 10, wherein the voltage-to-current buffer includes a low voltage bandgap (LVBG) source coupled to a multiplexer.

* * * * *